US006208674B1

(12) United States Patent
Webb et al.

(10) Patent No.: US 6,208,674 B1
(45) Date of Patent: Mar. 27, 2001

(54) LASER CHAMBER WITH FULLY INTEGRATED ELECTRODE FEEDTHROUGH MAIN INSULATOR

(75) Inventors: R. Kyle Webb, Escondido; William N. Partlo, Poway, both of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/386,938

(22) Filed: Aug. 31, 1999

Related U.S. Application Data

(63) Continuation-in-part of application No. 09/157,067, filed on Sep. 18, 1998, now Pat. No. 6,128,323.

(51) Int. Cl.[7] .............................. H01S 3/22; H01S 3/03; H01S 3/097
(52) U.S. Cl. .............................. 372/57; 372/55; 372/65; 372/87
(58) Field of Search ................... 372/55, 57, 65, 372/87

(56) References Cited

U.S. PATENT DOCUMENTS

| | | | |
|---|---|---|---|
| 4,959,840 | * | 9/1990 | Akins et al. ................ 372/57 |
| 5,033,055 | * | 7/1991 | Akins et al. ................ 372/57 |
| 5,771,258 | * | 6/1998 | Morton et al. .............. 372/57 |
| 5,991,324 | * | 11/1999 | Knowles et al. ............ 372/57 |

FOREIGN PATENT DOCUMENTS

02144978  *  6/1990  (JP) .

\* cited by examiner

Primary Examiner—Frank G. Font
Assistant Examiner—Armando Rodriguez
(74) Attorney, Agent, or Firm—John R. Ross, Esq.

(57) ABSTRACT

A feedthrough structure of a gas discharge laser chamber conducts electric power through the wall of a sealed gas enclosure to a single piece electrode inside the enclosure. The feedthrough structure includes a single piece integrated main insulator larger than the electrode. The main insulator is compressed between the electrode and the wall of the enclosure. The surfaces forming interfaces between the electrode and the single piece insulator are the insulator and the wall are all very smooth to permit the parts to expand and contract as the chamber temperature varies. The feedthrough structure also provides mechanical support and alignment for the electrode and includes seals to prevent gas leakage around the feedthrough structure.

24 Claims, 6 Drawing Sheets

LASER CHAMBER WITH FULLY INTEGRATED ELECTRODE FEEDTHROUGH MAIN INSULATOR

This application is a continuation-in-part of Ser. No. 09/157,067, filed Sept. 18, 1998, now U.S. Pat. No. 6,128,323 issued Oct. 3, 2000, "Reliable, Modular, Production Quality Narrow-Band High Rep Rate Excimer Laser".

FIELD OF THE INVENTION

The present invention relates generally to laser chambers for excimer lasers and other electric discharge lasers and more particular to pulse high voltage feedthrough structures for such chambers.

BACKGROUND

FIGS. 1A and 1B are cross-sectional views showing the inner structure of a laser chamber 10 in a conventional transversely excited (TE) excimer laser (see Akins et al., U.S. Pat. No. 4,959,840, issued Sept. 25, 1990, and incorporated herein by reference in its entirety). FIGS. 1A and 1B are excerpts from the '840 patent. FIG. 1C is a cross section similar to FIG. 1B but showing the entire length of a prior art laser chamber. A laser enclosure 10 provides isolation between a laser chamber interior and the exterior. Typically enclosure 100 is formed by upper and lower enclosure members 12 and 14, which are coupled together and sealed using an o-ring seal 16, extending along a perimeter of enclosure 10. The laser chamber interior is filled to a predetermined pressure with a lasing gas mixture including the hazardous gas fluorine, $F_2$. A pulsed electric discharge is generated in the lasing gas mixture in a discharge region 22 by a high voltage pulse applied between a cathode assembly 18 and an anode assembly 20. Since anode assembly 20 is generally electrically grounded to laser enclosure 10, the entire pulse high voltage is applied between cathode assembly 18 and upper enclosure member 12. The pulsed gas discharge typically produces excited fluorine, argon fluoride or krypton fluoride molecules, which generate laser pulse output energy. The pulse output energy propagates from discharge region 22 through an optical output window assembly (not shown in FIG. 1A). Cathode assembly 18 and anode assembly 20, defining discharge region 22, and extend for about 28 inches substantially parallel to one another for most of the length of laser chamber 10 perpendicular to the plane of FIG. 1A.

Recirculation of the lasing gas mixture is provided by a tangential fan 46. As shown by arrows in FIG. 1A, the flow of lasing gas mixture is upward through tangential fan 46 and transversely across discharge region 22 as directed by a vane member 52. The lasing gas mixture that has flowed through discharge region 22 becomes dissociated and heated considerably by the pulsed gas discharge. A gas-to-liquid heat exchanger 58, extending substantially the length of laser chamber 10 perpendicular to the plane of FIG. 1A, is positioned in the gas recirculation path to cool the heated gas. Recirculation cools and recombines the lasing gas mixture, thereby allowing repetitively pulsed laser operation without replacing the lasing gas mixture.

In this prior art chamber high voltage pulses in the range of about 16 kv to 30 kv are applied to cathode 20 at repetition rates of about 1000 pulses per second from a high voltage bus 70 mounted on top of chamber 10 as shown in FIG. 1C. Bus 70 consists of a thin copper plate mounted on a ½ thick aluminum plate with rounded surfaces. (This aluminum plate is referred to as a "corona plate" since its purpose is to reduce or minimize corona discharge from the high voltage bus.) The bus is energized by a peaking capacitor bank typically consisting of 28 individual capacitors (not shown) mounted in parallel and electrically connected between bus 70 and the metal enclosure 10 which functions as ground. The high voltage pulses are transmitted to cathode 18 through a feedthrough structure consisting primarily of 15 feedthrough conductor assemblies 72 as shown in FIGS 1A, B and C.

Cathode 18 and each of the 15 feedthrough conductors carrying peak voltages in the range of 16 kv to 30 kv must be insulated from the metal surfaces of enclosure 10 which is at ground potential. Because of the corrosive F2 environment inside the chamber only certain high purity ceramic insulators such as high purity $AlO_2$ can be used for the portion of the feedthrough assemblies exposed to the gas environment.

With a design of the type shown in FIGS. 1A, B and C ceramic parts 28 are sandwiched in between a brass part 32 and an aluminum part 12. The laser chamber is subject to temperature swings between normal ambient temperature of about 23° C. and temperature of about 120° C. The coefficients of thermal expansion of aluminum, brass and $AlO_2$ are about $23 \times 10^{-6}/°$ C., $20 \times 10^{-6}/°$ C. and $8 \times 10^{-6}/°$ C. respectively. The distance between the two end feedthroughs is about 22 inches. Therefore, in this distance a 100° C. temperature increase would produce unrestrained expansions of about 0.052 inch, 0.045 inch and 0.017 inch respectively for aluminum, brass and $AlO_2$. This makes a difference of about 1/32 inch between the ceramic and metal parts.

It is important that good seals be provided for the feedthrough assemblies to prevent hazardous fluorine from escaping into the working environment.

The issues discussed above have been dealt with in the design of the laser portrayed in FIGS. 1A, B and C. This laser utilizes three main insulators 28A, 28B and 28C to insulate the cathode 18 from the chamber member 12. In this prior art design as shown in FIG. 1C, fifteen feedthrough connectors are separated into three separate groups so that the effective length of the sealed region of each of the resulting metal-ceramic-metal sandwiches is only about 6 inches. This reduces the differential expansion by a factor of about 3.5 as compared to a single piece insulator covering the entire electrode length. Sealing at the feedthroughs is provided by tin-plated, nickel-copper alloy "C" seals 32 and 34 as shown in FIGS. 1A and 1B. Seal 32 are circular seals making a seal around each of the 15 feedthroughs at the insulator 28, cathode support 26 interface. Each of three seals 34 make the seal between the bottom of upper chamber 12 and the top of one of the three insulator plates 28, each seal 34 providing a single seal around five feedthroughs.

In this prior art design, cathode support bar 26 is bolted to cathode 18. Threaded feedthrough rod 36 threads into cathode support bar 26. Feedthrough insulator 41 insulates rod 36 and a feedthrough nut (not shown in FIGS. 1A and 1B) is threaded onto feedthrough rod 36 and holds insulator 41 in place. A holddown bolt with a Belleville washer is passed through an insulator cap called a "buttercup" is then screwed into the feedthrough nut to apply a compressive force clamping the electrode support to the top inside wall of the chamber with insulator plate 28 and seals 34 and 32 sandwiched in between.

The prior art feedthrough designs shown in FIGS. 1A, B and C has been commercially very successful and is utilized in hundreds of excimer lasers currently operating around the world. The design is basically trouble-free with extremely minimal problems with leakage or electrical failure despite the harsh $F_2$ environment and in many cases continuous round-the-clock operation for weeks and months at at time.

However, the very large number of parts of the above described prior art design make the fabrication expensive. Also, a need exists for a reduction in the electrical inductance associated with the feedthrough design. Therefore a need exists for a better electrical feedthrough system for electric discharge lasers.

SUMMARY

A feedthrough structure of a gas discharge laser chamber conducts electric power through the wall of a sealed gas enclosure to a single piece elongated electrode inside the enclosure. The feedthrough structure includes a single piece integrated main insulator larger than the electrode. The main insulator is compressed between the electrode and the wall of the enclosure. The surfaces forming interfaces between the electrode and the single piece insulator and between the insulator and the wall are all very smooth to permit the parts to expand and contract as the chamber temperature varies. The feedthrough structure also provides mechanical support and alignment for the electrode and includes seals to prevent gas leakage around the feedthrough structure.

A plurality of hollow substantially cylindrical feedthrough insulators integral with the integrated main insulator extend from the upper surface of the integrated main insulator, typically in an evenly spaced row. Each integral feedthrough insulator contains a substantially concentric hole that extends through to the lower surface of the integrated main insulator and accommodates a feedthrough electrical conductor. In a preferred embodiment, each substantially cylindrical feedthrough insulator includes a concentric groove around its outer diameter. In some embodiments, the integrated main insulator is made of a ceramic material, typically 99.5 per cent purity alumina.

The integrated main insulator is clamped between a lower electrode and an upper inner wall of the sealed enclosure, such that the integral feedthrough insulators extend through aligned clearance holes in the enclosure wall. Clamping is typically provided by threading the lower end of the feedthrough electrical conductor into the electrode and tensioning the upper end against an insulating "buttercup" structure on the upper outer wall of the sealed enclosure. Relatively constant clamping forces are preferably provided using Belleville washers. To limit relative thermal expansion between the enclosure and the single piece main insulator the insulator is tightly restrained only at its center position permitting relative expansion and contraction only from its center.

Face seals are provided at the interfaces between the polished surfaces of the integrated main insulator and the respective opposing faces of the electrode and the inner wall of the sealed enclosure. These face seals are positioned substantially concentrically surround the holes through the integral feedthrough insulators, thereby sealing against gas leaks. The face seals preferably sit in grooves in the electrode and the inner wall of the sealed enclosure. The face seals preferably are tin-plated copper-nickel substrate "C"-seals. Advantageously, these face seals slide compliantly over the polished surfaces of the integrated main insulator, accommodating differential thermal expansion over a temperature range extending to 100° C. above ambient without loss of integrity.

In a preferred embodiment, the electrode is a cathode, or more specifically the cathode of an electric discharge laser, such as an argon fluoride or krypton fluoride excimer laser, or a fluorine molecular laser.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent to those skilled in the art by referencing the accompanying drawings. For simplicity and ease of understanding, common numbering of elements within the illustrations is employed where an element is the same in different drawings.

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent. These descriptions and drawings are not to be considered in a limiting sense as it is understood that the present invention is in no way limited to the embodiments illustrated.

Figure 2:
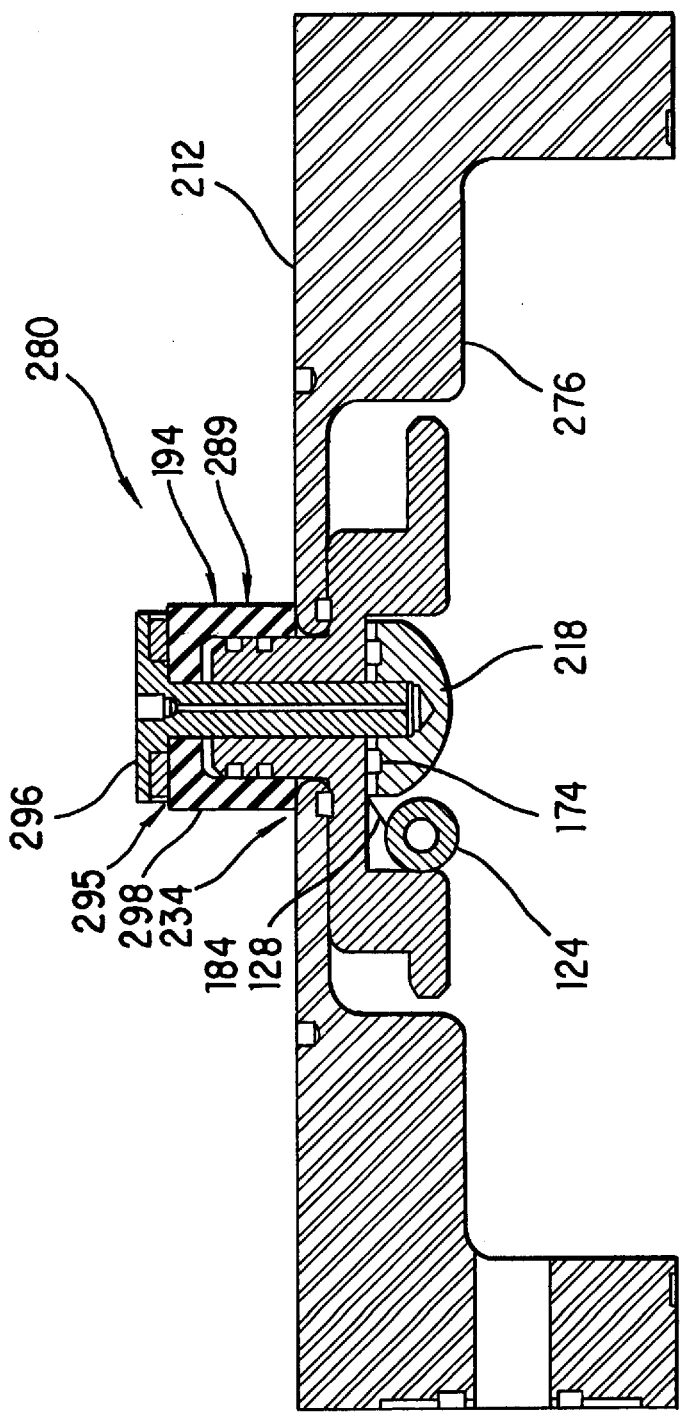
FIG. 2 is a cross-sectional view showing a portion of an upper enclosure member attached to a cathode assembly including an improved feedthrough structure, in accordance with the present invention.
Figure 3:
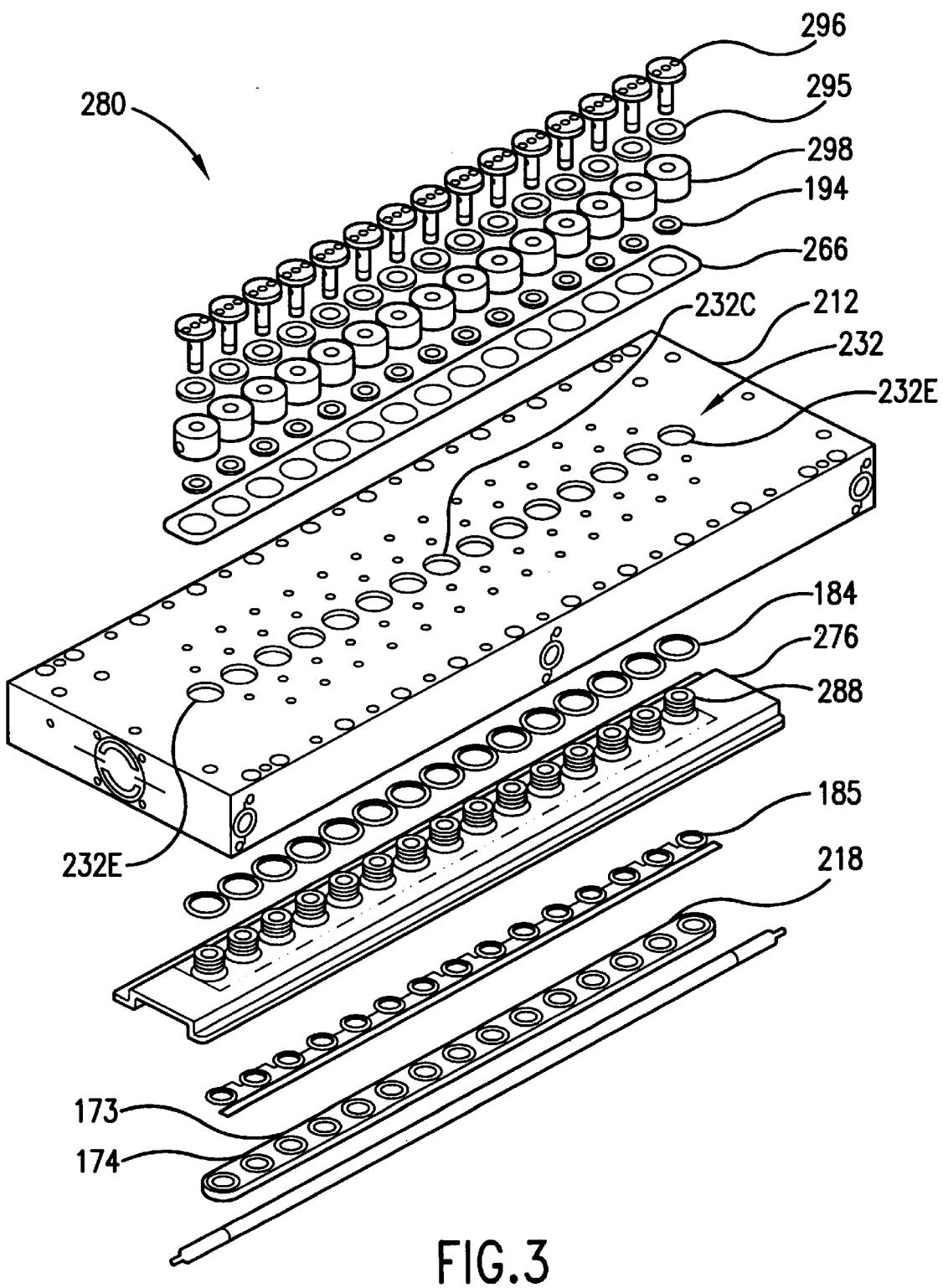
FIG. 3 is an exploded perspective view showing the components of the improved cathode assembly of FIG. 2.

FIG. 2 is a cross-sectional view showing a portion of an upper enclosure member 212 to which is attached cathode assembly 218 including an improved feedthrough structure 280, in accordance with the present invention. FIG. 3 is an exploded perspective view showing the components of feedthrough structure 280 and upper enclosure 212. Among other things, feedthrough structure features a single piece integrated main insulator 276 including self-contained integral feedthrough insulators 288 and polished sealing surfaces. Upper enclosure member 212 includes fifteen clearance holes 232 that are shaped, such that structural alignment is maintained without constraining thermal expansion. Sliding face seals 184, 185 are set into properly dimensioned grooves 234 in the inside surface of upper enclosure 212 (see FIG. 2 and FIG. 5) and grooves 174 in the top of electrodes 218 (see FIG. 2). These seals provide gas-tight integrity without transmitting torque within feedthrough structure 280, since they slip on polished surfaces of main insulator 276.

Figure 4:
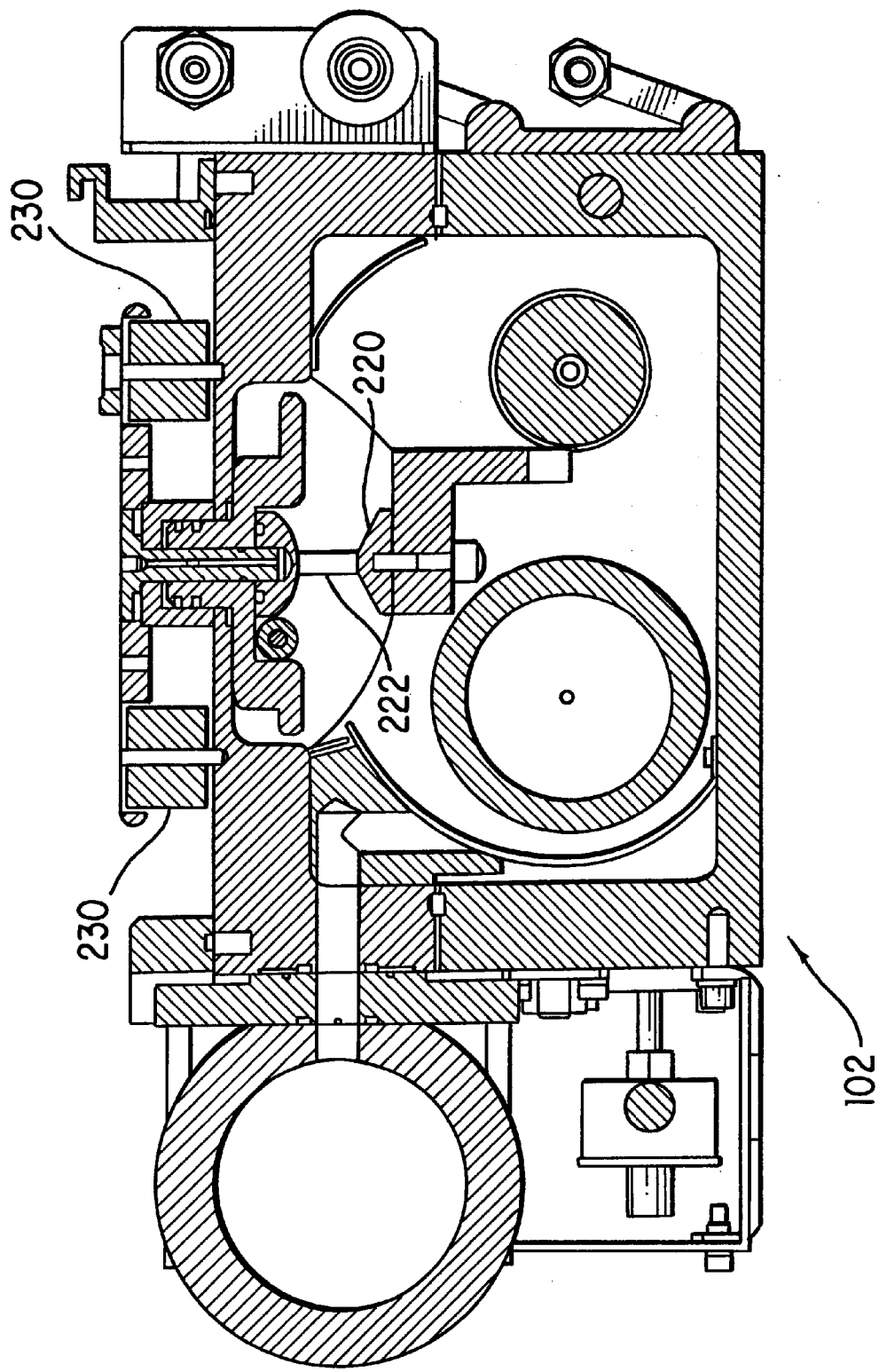
FIG. 4 is a cross section of a laser chamber utilizing its improved feedthrough structure.

A cathode 218, made of brass is fastened to an upper enclosure member 212 using feedthrough structure 280, such that cathode 218 is positioned above and aligned longitudinally parallel with an anode assembly 220 (shown in FIG. 4) across a discharge region 222. Along the centerline of the upper surface of cathode 218 are fifteen of substantially identical evenly spaced blind tapped holes 173, as in FIG. 3. Concentric with each of tapped holes 173 is annular groove 174.

Feedthrough structure 280 provides mechanical support, high pulse voltage electrical contact, and electrical isolation for cathode 218, as well as sealing against gas leakage around the electrical feedthroughs. Feedthrough structure 280 includes a shaped, longitudinally extended single piece integrated main insulator 276, generally made of alumina, having a single row of multiple substantially evenly spaced vertical holes concentric through substantially cylindrical integral feedthrough insulators 288 extending perpendicular from an upper face of single piece integrated main insulator 276, in alignment with blind tapped holes 173 of cathode 170. Single piece integrated main insulator 276 is fabricated using methods known in the art, e.g., casting and machining "green" ceramic material, high-temperature firing, and then finish machining the fired ceramic. Both upper and lower faces of integrated main insulator 276 are polished, typically to a surface finish of 16 microinches (0.41 micronss), providing improved sealing against cathode 218 and upper enclosure member 212. Integral feedthrough insulators 288 each have two outer concentric grooves 289 as shown in FIG. 2. Feedthrough structure 280 also includes multiple (one per each blind tapped hole 173 in cathode 28) threaded feedthrough bolts 296, large diameter and small diameter face seals 184 and 185 respectively comprising tin-plated "C"-seals. Feedthrough structure 280 further includes multiple silicone rubber gaskets 194, properly sized Belleville washers 295, and insulating ceramic "buttercups" 298. Feedthrough structure 280 additionally includes a gas purge shield 266 consisting of a flat polyimide or similar insulating strip, containing a single row of clearance holes in alignment with the fifteen blind tapped holes 173 in cathode 218.

As illustrated in FIG. 2, a small diameter face seal 185 is inserted into each concentric annular groove 174 in cathode 218. Integrated main insulator 276 is aligned with blind tapped holes 173 and is seated onto face seals 185 inserted into cathode 218.

Upper enclosure member 212, preferably made of aluminum, has a single row of fifteen clearance holes 232 through its top wall in substantially aligned with blind tapped holes 173 of cathode 218. On the inner face of upper enclosure member 212 concentric with each clearance hole is an annular groove 234 (shown in FIG. 2). A large diameter face seal 184 is inserted into each annular groove 234 of upper enclosure member 212. Upper enclosure member 212 is aligned and seated over integral feedthrough insulators 288. Gas purge shield 266 is aligned and seated over integral feedthrough insulators 288 onto the outer face of upper enclosure member 212 as indicated in FIG. 3. A silicone rubber gasket 194 is positioned concentrically on top of each integral feedthrough insulator 288. A "buttercup" 298 is slidably installed over each integral feedthrough insulator 288, and a brass feedthrough bolt 296 with a steel Belleville washer 295 is inserted through a clearance hole in each "buttercup" 298 and through integral feedthrough insulator 288 into blind tapped hole 173. Feedthrough bolts 296 are engaged and tightened into blind tapped holes 173 of cathode 174 using a tightening torque of approximately 200 inch-lbs (2.3 kg-meters). This torque is sufficient to compress the Belleville washer sufficiently to produce a force per bolt of about 2,400 pounds. Thus the total compression of the enclosure, main insulator cathode sandwich is about 36,000 pounds. The outer flange of feedthrough bolts 296 are electrically connected with the high voltage side of a pulse high voltage capacitor bank 230 and serve as feedthrough electrical conductors to cathode 218.

Adjacent to cathode 218 is a preionizer tube 124, which extends substantially parallel to cathode 218 for almost all of the length of laser enclosure 102 and assists in initiating the pulsed electric discharge by creating a high instantaneous electric field. A preionizer rod is made of electrically conductive material, commonly brass and is inserted longitudinally into a tube made of an electrically insulating material. A high instantaneous electric field created by preionizer tube 124 and an electrically conductive shim 128, typically made of a thin sheet of brass and extending transversely from and electrically connected to cathode 218. A long thin edge of shim 128 presses against the side of preionizer rod to produce a very high electric field and a corona discharge around the preionizer just prior to peak voltage during each pulse.

Figure 5:
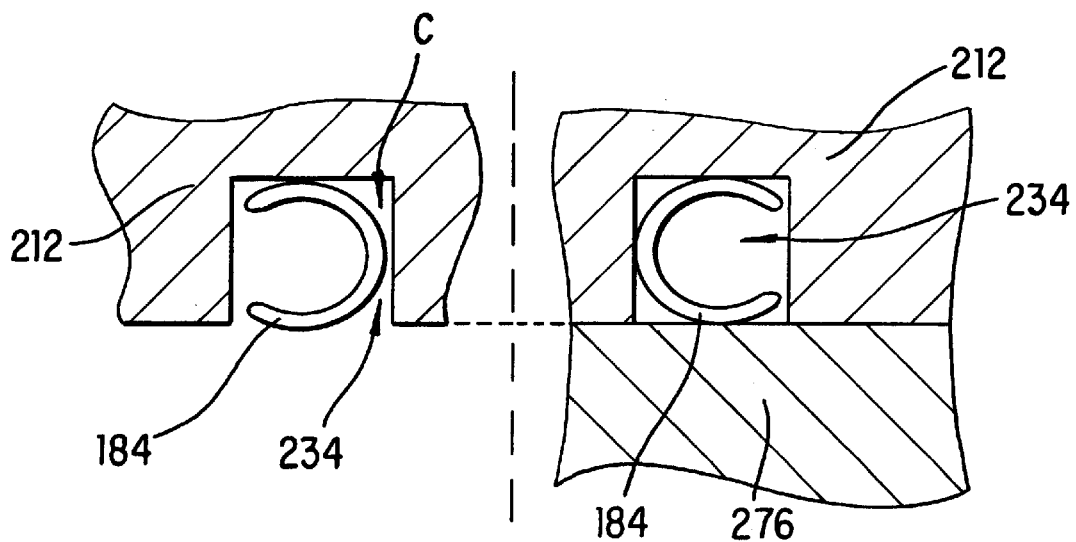
FIG. 5 is a cross sectional view demonstrating the function of a face seal.
Figure 1C:
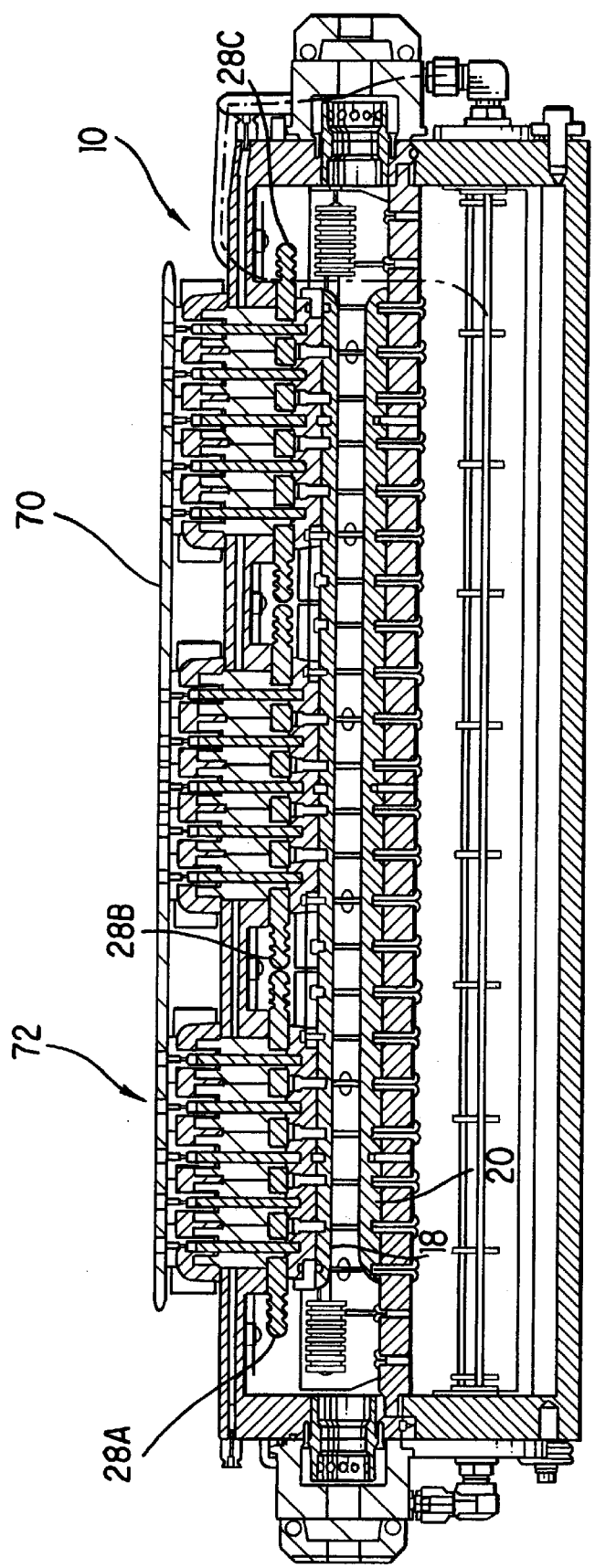
FIG. 1C is an expanded view similar to FIG. 1B but showing a cross section of the whole chamber.

FIG. 5 is a split cross-sectional view illustrating the proper dimensioning of annular groove 234 in upper enclosure member 212 relative to face seal 184. In the left hand portion of FIG. 5 is shown a section of face seal 184 in annular groove 234 with the opposing upper face of single piece integrated main insulator 276 removed. It will be noted that, unlike interference A shown in FIG. 5, there is a clearance C between the inside diameters of face seal 184 and annular groove 234 respectively. In the right hand portion of FIG. 5, face seal 184 is shown compressed between annular groove 234 and opposing upper face of single piece integrated main insulator 276. The compressive constraints do not cause distortion of the inside diameter of face seal 184, preserving the integrity of the seal and protecting "C"-ring 184 against material fatigue failure.

The present invention provides important improvements over prior art feedthrough designs. The number of individual parts is reduced. Assembly and processing time and effort are reduced. This is facilitated by the bolt torque procedure described above. Interconnecting part stack-ups are reduced. In the worst case accumulated vertical tolerance stack-up, the vertical clearance variation between integral feedthrough insulator 288 and "buttercup" 298 is only 0.012 inch (0.30 mm).

Figure 1A:
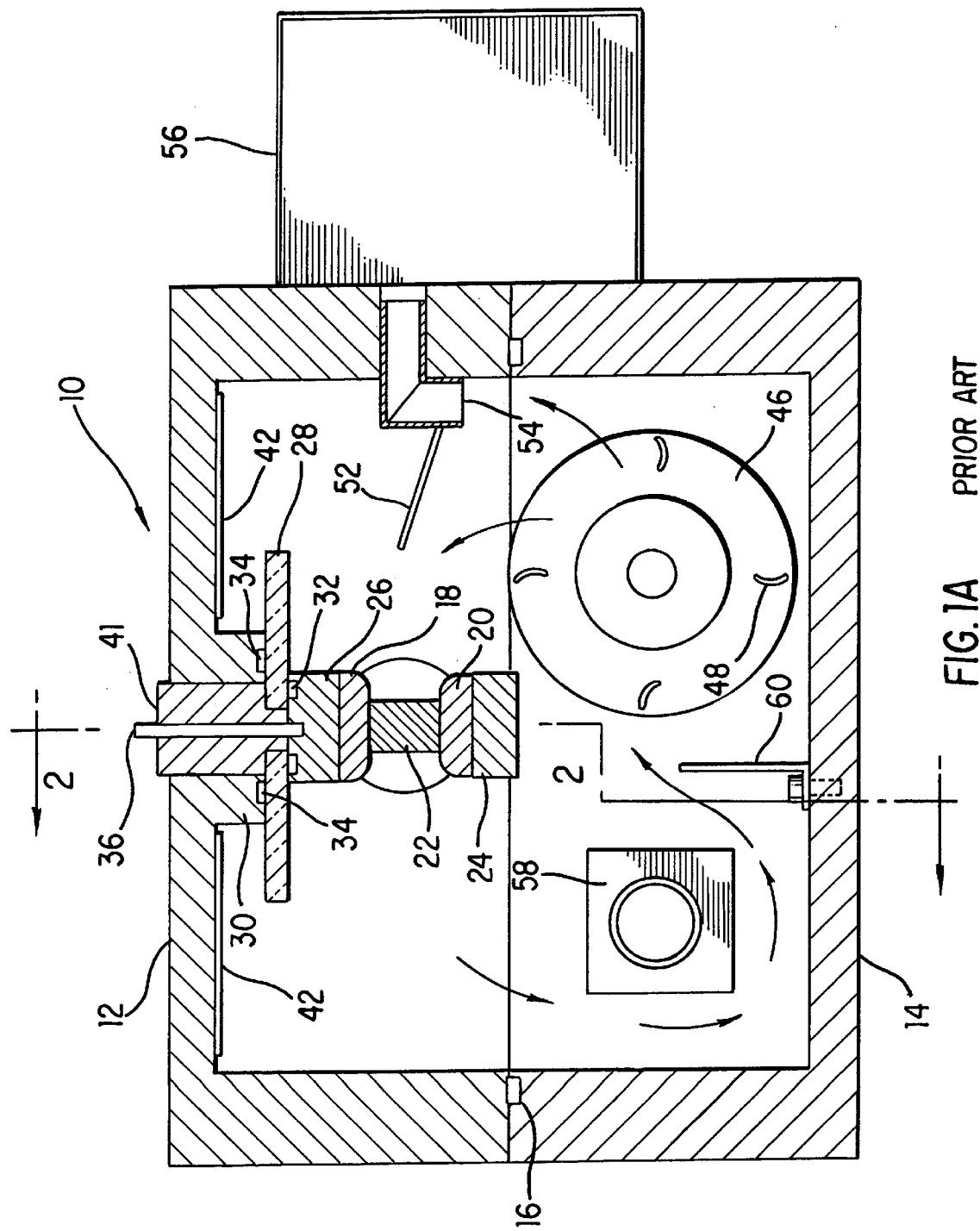
FIG. 1A is a cross-sectional end view showing the inner structure of a laser chamber 100 in a conventional TE excimer laser and a reproduction of FIG. 1 of the '840 patent.
Figure 1B:
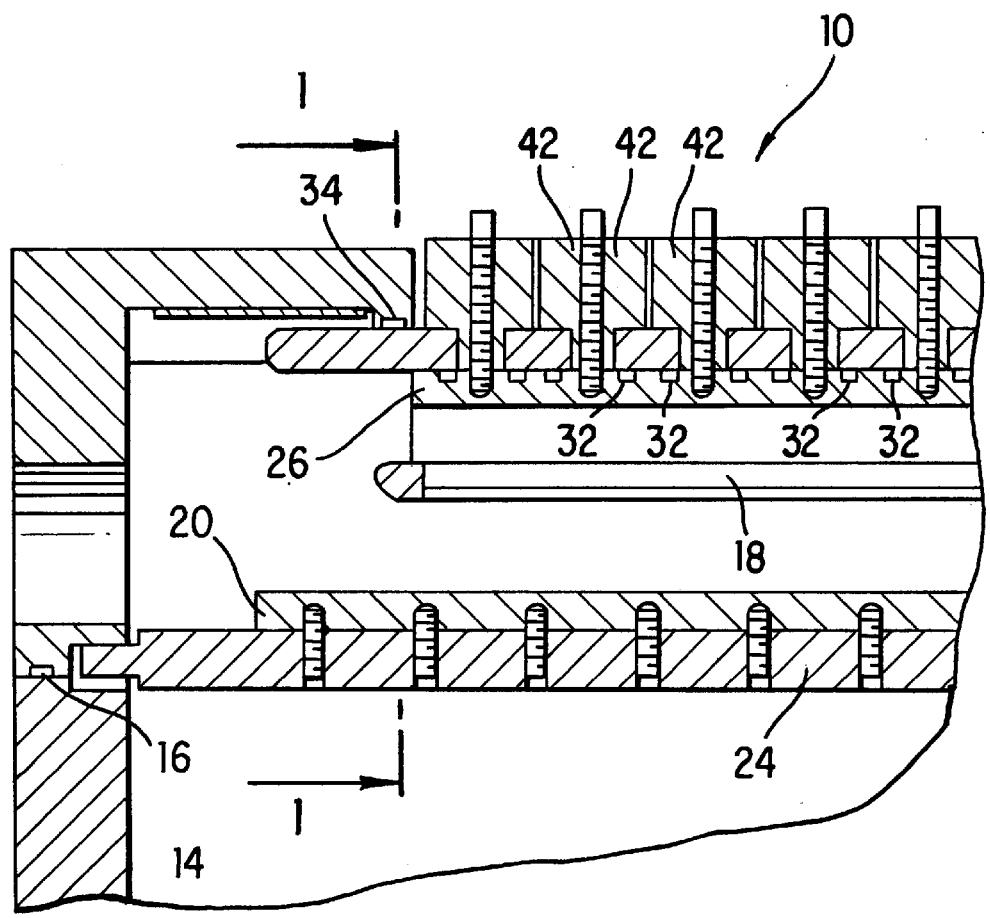
FIG. 1B is a chamber cross section and a reproduction of FIG. 2 of the '840 patent.

Single piece integrated main insulator 276 includes self-contained integral feedthrough insulators 288, replacing the complex individual feedthrough insulators such as insulator 41 shown in FIG. 1A. This eliminates the problematic similar material sliding interface between insulators 41 and 28 as shown in FIG. 1A. The integrated insulator also eliminates the need for an anti-corona gasket at the interface.

Figure 6:
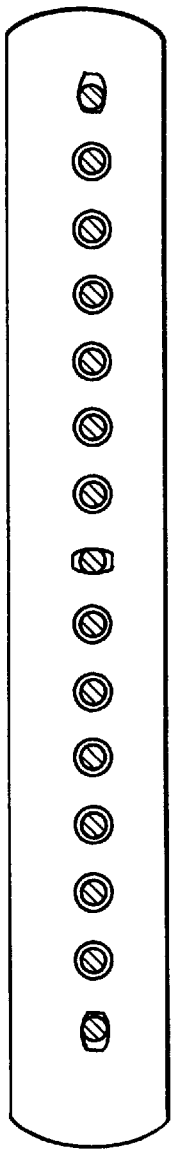
FIG. 6 is a drawing showing the general shape of feedthrough holes in a single piece insulator.

A center longitudinal datum is established, minimizing longitudinal tolerance accumulation and overall longitudinal differential thermal expansion. The center clearance hole 232C in upper enclosure member 212 also provides a physical positional locator, from which all parts are dimensioned and toleranced. Worst case clearance at center hole 232 is 0.0020 inch (0.051 mm). This allows precise tolerancing and positioning of other features of feedthrough structure 280. Worst case required longitudinal clearance at the end clearance hole 232E in upper enclosure member 212 is 0.0130 inch (0.33 mm), and between "buttercup" 298 and integral feedthrough insulator 288 is 0.0135 inch (0.343 mm). End clearance holes 232E in upper enclosure member 212 are ovally elongated longitudinally, thereby providing lateral structural alignment while permitting longitudinal differential expansion. Clearance holes 232 located longitudinally between the center and ends in upper enclosure member 212 are symmetrically radially enlarged, thereby accommodating both longitudinal and lateral relative motions without overconstraint. Compressive force of about 36,000 pounds provided by compressive Belleville washers 295 permit main insulator 276 to slide relative to enclosure 212 and electrode 218 in response to thermal stresses. The diameter of twelve of the bolt holes through insulator 276 as with enclosure 212 is chosen to be large enough to permit thermal expansion and contraction of the insulator without interference. As shown in FIG. 6, the center hole provides a tight fit (similar to enclosure 212) for the bolt in the laser axial direction, but the hole is enlarged in the direction perpendicular to axial to allow some small movement in that perpendicular direction. The two end holes provide a tight fit in the perpendicular direction but are enlarged in the axial direction. This arrangement forces the insulator to expand and contract relative to the cathode 218 and enclosure 212 from the axial center of the electrode and the insulator. The two end holes aligns the insulator relative to the cathode in the perpendicular direction. Thus the main insulator 276 is effectively completely restrained between enclosure 212 and electrode 218 at only one point, i.e., at the center hole 232C in enclosure 212.

Use of aluminum in upper enclosure member 212 provides a close thermal expansion match to brass cathode 174. Although very slight bending of feedthrough bolt 296 occurs under differential thermal expansion, this bending is accommodated by enlarged clearance holes through integral feedthrough insulator 288. Face seals 184, 185, being tin-plated "C"-seals, have a low coefficient of friction and readily slide without failure or loss of seal across their respective opposing polished alumina surfaces of single piece integrated main insulator 276. Applicants have confirmed the integrity of the design through thermal cycling exceeding expected lifetime cycling.

The compliant feedthrough apparatus and method above accommodate repeated thermal expansions and contractions over temperature range to 100° C. above ambient. Thereby the above-described embodiments provide an improved apparatus and method of mechanically supporting, conducting high voltage pulsed electric power, electrically isolating, and sealing against gas leakage a structure substantially surrounded by a closed chamber, particularly a structure including an electrode. Such an electrode can be a cathode of an electric discharge laser, more particularly of a krypton fluoride or argon fluoride excimer laser, or of a fluorine ($F_2$) molecular gas laser.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus for conducting high electric power through the wall of a sealed chamber of an electric discharge laser to an elongated electrode inside the chamber, defining an electrode length, comprising:

a single piece main insulator of an electrically insulating material larger than said electrode length, said main insulator comprising:
 a first polished substantially planar surface portion and a second polished substantially planar surface portion substantially parallel to said first polished substantially planar surface portion; and
 a plurality of substantially cylindrical feedthrough insulator portions integral with said single piece main insulator and extending from said first polished substantially planar surface portion;
 wherein a substantially cylindrical hole extends substantially coaxially through said cylindrical feedthrough insulator portion and through said first and said second polished substantially planar surface portions.

2. The apparatus of claim 1, wherein said feedthrough insulator portion further comprises a substantially concentric outer groove.

3. The apparatus of claim 1, wherein said first and said second polished substantially planar surface portions have a surface finish of approximately 16 microinches (0.4 micronss).

4. The apparatus of claim 1, wherein said electrically insulating material is alumina ceramic having a purity greater than approximately 99.5 per cent.

5. The apparatus of claim 1, further comprising face seals compressed against said first and said second polished substantially planar surface portions, each of said face seals substantially concentrically surrounding said substantially cylindrical hole.

6. The apparatus of claim 5, wherein the composition of said face seal is dissimilar from said electrically insulating material.

7. The apparatus of claim 6, wherein said composition is tin-plating on a nickel-copper alloy substrate.

8. The apparatus of claim 5, wherein said face seal is configured as a substantially toroidal ring having a cross-sectional shape approximating the shape of a letter "C" with an open portion of said cross-sectional shape facing toward the outside diameter of said ring.

9. The apparatus of claim 1, further comprising:
 at least one feedthrough electrical conductor disposed substantially coaxially through said substantially cylindrical hole; and
 an electrode connected to said feedthrough electrical conductor, said electrode disposed adjacent said second polished substantially planar surface portion.

10. The apparatus of claim 9, wherein said electrode is a cathode.

11. The apparatus of claim 1, wherein said electric discharge laser is selected from a group consisting of argon fluoride excimer lasers, krypton fluoride excimer lasers, and fluorine ($F_2$) molecular lasers.

12. An apparatus for conducting high electric power, comprising:
a main insulator of an electrically insulating material, said main insulator comprising:
 a first polished substantially planar surface portion and a second polished substantially planar surface portion substantially parallel to said first polished substantially planar surface portion; and
 a plurality of substantially cylindrical feedthrough insulator portions integral with said main insulator and extending from said first polished substantially planar surface portion;
 wherein a substantially cylindrical hole extends substantially coaxially through said cylindrical feedthrough insulator portion and through said first and said second polished substantially planar surface portions.

13. A method of conducting high electric power over a range of operating tempertures through a wall of a sealed gas enclosure of an electric discharge laser to an electrode substantially surrounded by said enclosure, comprising conducting said electric power through said wall within a plurality of feedthrough electrical conductors, each said feedthrough electrical conductor being surrounded substantially cylindrically by a substantially tubular feedthrough insulator portion integral with and extending from a first polished substantially planar surface portion of a single piece main insulator made of an electrically insulating material, said single piece main insulator further comprising a second polished substantially planar surface portion substantially parallel to said first polished substantially planar surface portion.

14. The method of claim 13, wherein said feedthrough insulator portion further comprises a substantially concentric outer groove.

15. The method of claim 13, wherein said first and said second polished substantially planar surface portions have a surface finish of approximately 16 microinches (0.4 micronss).

16. The method of claim 13, wherein said electrically insulating material is alumina ceramic having a purity greater than approximately 99.5 per cent.

17. The method of claim 13, wherein face seals are compressed against said first and said second polished substantially planar surface portions, each of said face seals substantially concentrically surrounding one of said feedthrough electrical conductors.

18. The method of claim 17, wherein the composition of said face seal is dissimilar from said electrically insulating material.

19. The method of claim 18, wherein said composition is tin-plating on a nickel-copper alloy substrate.

20. The method of claim 18, wherein said face seals slide in a compliant fashion across said first and said second polished substantially planar surface portions in response to variation of said operating temperature over said range.

21. The method of claim 17, wherein said face seal is configured as a substantially toroidal ring having a cross-sectional shape approximating the shape of a letter "C" with an open portion of said cross-sectional shape facing toward the outside diameter of said ring.

22. The method of claim 13, wherein said range of operating temperatures extends from ambient temperature to 100° C. above ambient temperature.

23. The method of claim 13, wherein said electrode is a cathode.

24. The method of claim 13, wherein said electric discharge laser is selected from a group consisting of argon fluoride excimer lasers, krypton fluoride excimer lasers, and fluorine ($F_2$) molecular lasers.

* * * * *